United States Patent [19]
Kobayashi

[11] Patent Number: 5,422,641
[45] Date of Patent: Jun. 6, 1995

[54] DIGITAL MODULATOR AND DEMODULATOR CIRCUIT

[75] Inventor: Yoshiharu Kobayashi, Kadoma, Japan

[73] Assignee: Matsushita Electric Industrial Co., Ltd., Osaka, Japan

[21] Appl. No.: 986,966

[22] Filed: Dec. 8, 1992

[30] Foreign Application Priority Data

Dec. 9, 1991 [JP] Japan .................. 3-323561
Feb. 21, 1992 [JP] Japan .................. 4-034658

[51] Int. Cl.$^6$ ............................................. H03M 7/40
[52] U.S. Cl. ..................................... 341/67; 341/59
[58] Field of Search ...................... 341/59, 60, 65, 67

[56] References Cited

U.S. PATENT DOCUMENTS

| | | |
|---|---|---|
| 4,115,768 | 9/1978 | Eggenberger et al. |
| 4,337,458 | 6/1982 | Cohn et al. |
| 4,568,916 | 2/1986 | Bahgat. |
| 4,860,324 | 8/1989 | Satomura. |
| 4,914,675 | 3/1990 | Fedele ........................ 341/67 |
| 4,985,700 | 1/1991 | Mikami ...................... 341/59 |
| 5,079,548 | 1/1992 | Fujiyama et al. .......... 341/67 |
| 5,173,694 | 12/1992 | Lynch, Jr. et al. ........ 341/59 |
| 5,175,545 | 12/1992 | Uchiyama .................. 341/59 |
| 5,233,348 | 8/1993 | Pollmann et al. ........ 341/67 |

FOREIGN PATENT DOCUMENTS 0083407 7/1983 European Pat. Off. .
0392506 10/1990 European Pat. Off. .
55-26494 7/1980 Japan .

OTHER PUBLICATIONS

*IBM Technical Disclosure Bulletin*, vol. 29, No. 1, pp. 32–34 (Jun., 1986).

*Primary Examiner*—Howard L. Williams
*Attorney, Agent, or Firm*—Ratner & Prestia

[57] ABSTRACT

In a digital modulator circuit for modulating a fixed-length code into a variable-length code and a digital demodulator for demodulating a variable-length code into a fixed-length code in a parallel data form, pre-modulation and pre-demodulation data is input to a logic circuit in synchronization with a pulse input, while a remainder of the fixed-length or variable-length code digital parallel input data taking place in modulating or demodulating process is fed back as an input to the logic circuit via a flip-flop to modulate or demodulate the data together with pre-modulation or pre-demodulation parallel data input at the next input pulse in a parallel data form. A post-modulation or post-demodulation data as well as a modulation or demodulation bit number output from the logic circuit are input to the buffer circuit to output post-modulation or post-demodulation data of which bits have been all modulated or demodulated.

6 Claims, 12 Drawing Sheets

Fig.4(1)

| TIME\DATA | a | a' | c | s | $s_1, s_2$ | i |
|---|---|---|---|---|---|---|
| T1 | 00000000 | xxxxxxxx | xxxxxxxxxxxx xxxxxx | xxxxxxxxxxxxx xxxxxxxxxx | xxxxxxxxxxxxx xxxxxxxxx | xxxxxxxxxx xxxxxx |
| T2 | 00000000 | 00000000 | 000100000100000000000000 0000000 (12bit) | xxxxxxxxxxxxx xxxxxxxxxx | xxxxxxxxxxxxx xxxxxxxxx | xxxxxxxxxx xxxxxx |
| T3 | 00000000 | 00000000 | 000100000100000010000001 0000000 (18bit) | 000100000100xxxxxxxx xxxxxx | xxxxxxxxxxxxx xxxxxxxxx | xxxxxxxxxx xxxxxx |

| TIME \ DATA | a | a' | c | s | $s_1, s_2$ | i |
|---|---|---|---|---|---|---|
| T6 | 00000000 | 00000000 | 000100000010000000 (18bit) | xxxxxxxxxxxxxx000100000100xxxx | 0100000100000100 (16bit) 0000010000010000000 (2bit) | 0000010000010000 |
| T7 | 00000000 | 00000000 | 000100000100000100000000 (18bit) | 000001000000100xxxxxxxxxxxxx0001 | 0100000100000100 0001000000100000000 (12bit) | 0100000100000100 |

| TIME \ DATA | j | j' | l | w | $w_1, w_2$ | r |
|---|---|---|---|---|---|---|
| T1 | 000100000100 0001 | xxxxxxxx | xxxxxxx xxx | xxxxxxxx xxxx | xxxxxxx xxxx | xxxxxxx |
| T2 | 000001000001 00000 | 000100000010 00001 | 000000000 000000 (6bit) | xxxxxxxxx xxx | xxxxxxx xxxx | xxxxxx |
| T3 | 010000000100 000100 | 000001000001 00000 | 000000000 000000000 (9bit) | xxxxxxxxxx xxxxxxxx 00000 | xxxxxx xxxx | xxxxxxx |

Fig.6(3)

| TIME \ DATA | j | j' | l | w | w₁, w₂ | r |
|---|---|---|---|---|---|---|
| T6 | 0100000100000100 | 0000001000000010000 | 000000000000000000 (9bit) | xx0000000xxxxx0000 | 00000000 00000000 (8bit) / 00000000 00000000 (1bit) | 00000000 |
| T7 | 0001000001000001 | 0100000100000100 | 000000000000000000 (9bit) | 00xxxxxx0000000 | 00000000 00000000 / 0000000 00000000 (6bit) | 00000000 |

DIGITAL MODULATOR AND DEMODULATOR CIRCUIT

BACKGROUND OF THE INVENTION

1. Field of the Invention

The present invention relates to a digital modulator and demodulator circuit for modulating a fixed-length code into a variable-length code and demodulating a variable-length code into a fixed-length code.

2. Description of the Prior Art

In a conventional modulator circuit for modulating a fixed-length code into a variable-length code, as shown in FIG. 7, a serial fixed-length code (binary code) consisting of serially arranged bits is modulated into a serial variable-length code, for example, Run Length Limited Code (referred to as "RLL (2, 7) code " hereinafter) as disclosed in the Japanese Patent Publication No. 55-26494.

In more detail, input serial data is modulated in such a manner that the input data is entered to a shift register in synchronization with an input clock pulse signal where the shift register consists of a plurality of flip-flops serially connected, and then each output data of the shift register is decoded thereby to obtain an output serial variable-length code. In regard of the RLL (2, 7) modulation code used in the above case, the resulting post-modulation data is doubled in amount with respect to the pre-modulation data, and therefore the shift register is made to operate at leading and trailing edges of a input period of a clock pulse signal input in synchronization with the data.

Also, in a conventional demodulator circuit for demodulating a variable-length code into a fixed-length code, as shown in FIG. 8, a serial variable-length code (RLL (2, 7) modulation code) is demodulated into a serial fixed-length code (binary code) as disclosed in the Japanese Patent Publication No. SHO 55-26494. In more detail, input Serial data is modulated in such a manner that the input serial data is entered to a shift register consisting of a plurality of flip-flops serially connected to each other and then each output data of the shift register is decoded thereby to obtain an output serial fixed-length code.

However, in the conventional modulator circuit for modulating a fixed-length code into a variable-length code as mentioned above, since the input serial data is directly processed in the shift register, the modulation circuit is required to operate at a speed two times higher than the input timing of the input clock pulse.

Meanwhile, in the conventional demodulator circuit for demodulating a variable-length code into a fixed-length code as mentioned above, since the input serial data is directly processed in the shift register, the demodulator circuit is required to operate at a speed identical to the input timing of the input clock pulse.

The above-mentioned type of a modulator and demodulator circuit requires a high-speed device for processing data at a high speed such as an ECL (Emitter Coupled Logic) device in performing data modulation and demodulation at a high transfer rate to therefor require high-grade digital circuit techniques, which results in a technical difficulty in many cases.

SUMMARY OF THE INVENTION

Accordingly, the present invention gives solution to the above-mentioned conventional problems, and an essential object of the present invention is to provide a digital modulator and demodulator circuit capable of modulating fixed-length code data into variable-length code data or demodulating variable-length code data into fixed-length code data at a high transfer rate utilizing a low operation-speed circuit without requiring to use a high-speed device such as an ECL.

In order to achieve the above-mentioned objective, a digital modulator circuit in which input digital parallel data of a fixed-length code fed from an external device is modulated in a form of a parallel data arrangement in synchronization with an input setting clock pulse signal for setting the input parallel data, thereby to generate digital parallel data of a variable-length code simultaneously with modulation bit number output representing the number of the bits of the modulated data included in the digital parallel post-modulation data, said digital modulator circuit comprises:

flip-flop means for latching the input parallel data which is operable in synchronization with the input clock pulse;

logic circuit means receiving the input parallel data of a fixed-length code via the flip-flop means thereby to generate an output consisting of the post-modulation data, modulated bit number output, digital parallel remainder bit output of a fixed-length code, and remainder bit number output, wherein the digital parallel remainder bit output represents a remainder of the non-modulated fixed-length code digital parallel data and the remainder bit number output represents the number of remainder bits included in the remainder bit output, where the remainder bit output and the remainder bit number output are both generated from the logic circuit means because the number of bits of the data to be modulated at one time of modulation does not generally coincide with the data amount of the pre-modulation data when modulating a fixed-length code into a variable-length code in response to the previous input pulse, wherein the remainder bit output and the remainder bit number output are fed back to the logic circuit means via the flip-flop means responsive to the previous input pulse previously input to the flip-flop means respectively as remainder bit input data of fixed-length code digital parallel data and remainder bit number input representing the number of remainder bit or bits included in the remainder bit input, whereby the remainder bit output data can be attached to the head of the fixed-length code input data in synchronization with the next input pulse so that the remainder bit output data can be modulated together with the next input fixed-length code data.

When a fixed-length code is modulated into a variable-length code by means of a modulator circuit having the above-mentioned construction, remainder bit output data can be attached to the head of the fixed-length code input data in synchronization with the next input pulse so that the remainder bit output data can be modulated together with the next input fixed-length code data, allowing to effect data modulation in a parallel data form.

Meanwhile, in a digital demodulator circuit in accordance with the present invention in a similar manner to that of the digital modulator circuit mentioned above, input digital parallel data of a variable-length code (referred to as the "pre-demodulation data" hereinafter) is entered to a demodulator circuit in synchronization with an input data setting clock pulse signal (referred to as "input pulse" hereinafter), and then the input digital parallel data is demodulated in the demodulator in a form of a parallel data arrangement, so that there are generated digital parallel data of a fixed-length code (referred to as "post-demodulation data" hereinafter) as well as a bit number output (referred to as "demodulation bit number output" hereinafter) included in the digital parallel data of a fixed-length code.

When a variable-length code is demodulated into a fixed-length code by means of a demodulator circuit having the above-mentioned construction, remainder bit output data can be attached to the head of the variable-length code input data in synchronization with the next input pulse thereby to be demodulated together with the next input variable-length code data, allowing to effect data demodulation in a parallel data form.

As described above, according to the digital modulator and demodulator circuit of the present invention, it becomes possible to modulate a parallel fixed-length code data into a parallel variable-length code data to allow the modulator circuit to have an operation frequency lower than that of the conventional case in which serial data has been modulated. Therefore, in the digital modulator circuit of the present invention, it is possible to perform easy modulation from fixed-length code data into variable-length code data at a high transfer rate. Furthermore, the parallel variable-length code data can be demodulated into parallel fixed-length code data to allow the demodulator circuit to have an operation frequency lower than that of the conventional case in which serial data has been demodulated, thereby to perform easy demodulation into fixed-length code data at a high transfer rate.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE PREFERRED EMBODIMENTS

Figure 1:
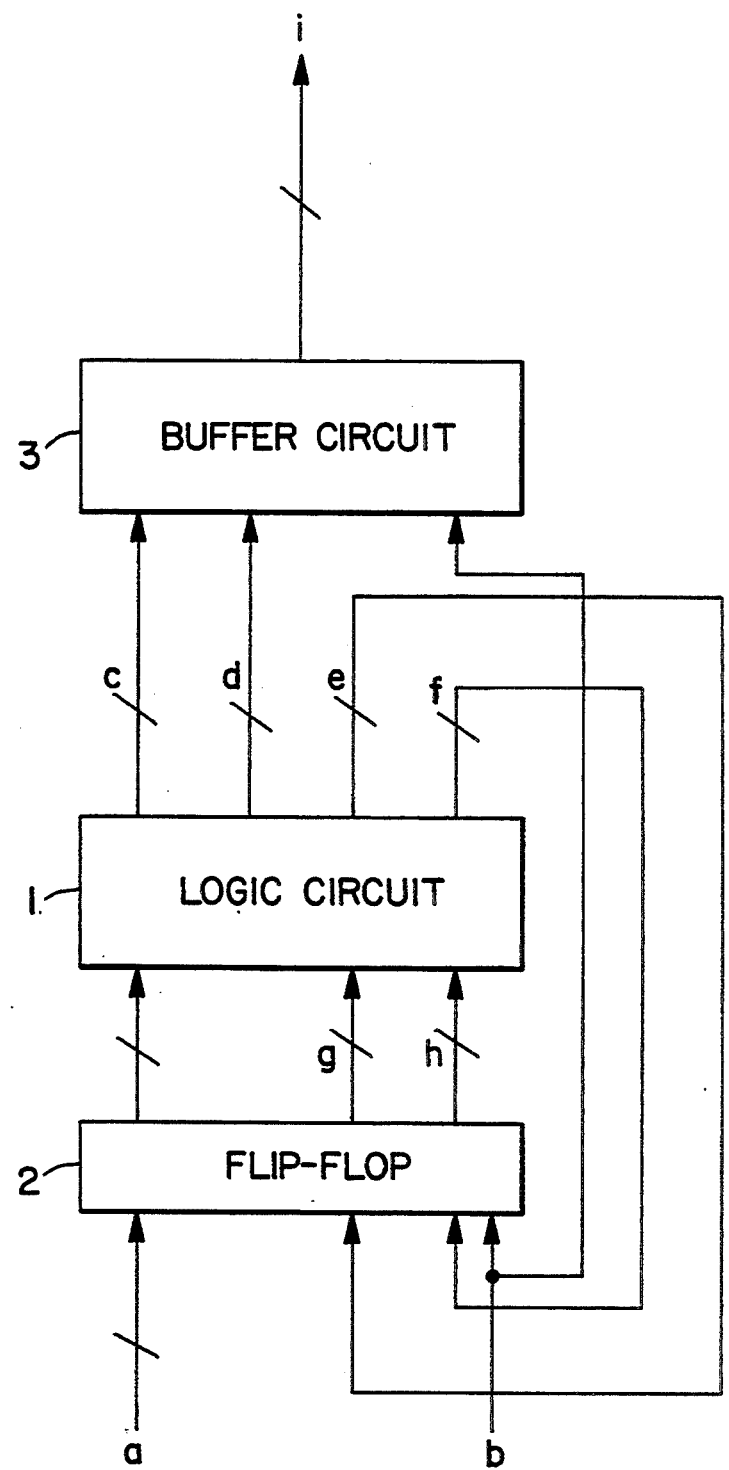
FIG. 1 is a block diagram for explaining a basic construction of a digital modulator circuit in accordance with the present invention.

The following describes a modulator circuit in accordance with an embodiment of the present invention with reference to the attached drawings.

It is noted here that the present embodiment is referred to a circuit for modulating a parallel fixed-length code into a parallel variable-length code and it is assumed that pre-modulation data amount is doubled after the data is subjected to RLL (2, 7) modulation as an example of variable-length codes carried out in the present embodiment.

The RLL (2, 7) modulation exemplified in the present embodiment is defined as shown in Table 1:

TABLE 1

| BINARY INPUT | RLL (2, 7) CODE |
|---|---|
| 10 | 0100 |
| 010 | 100100 |
| 0010 | 00100100 |
| 11 | 1000 |
| 011 | 001000 |
| 0011 | 00001000 |
| 000 | 000100 |

When parallel data of a fixed-length code is modulated into parallel data of a variable-length code, or when parallel data of a variable-length code is demodulated into parallel data of a fixed-length code, there is a problem that it can not be accomplished to complete modulation or demodulation of all the bits of the input parallel data. That is, the whole bits of the input parallel data can not be generally divided into modulation or demodulation units without remainder, and therefore a part of the bits of the input parallel data to be modulated or demodulated is left as non-modulated or non-demodulated remainder data. This remainder is produced because the whole bits of one time input parallel data can not be generally allotted in modulation or demodulation units without remainder.

Table 2 shows an example of producing remainder data to be processed when parallel binary coded data of 8 bits is modulated into parallel RLL (2, 7) coded data according to RLL (2, 7) modulation shown in Table 1:

TABLE 2

| | |
|---|---|
| FIRST INPUT BINARY DATA | 00000000b |
| DIVIDED IN A UNIT OF MODULATION | 000b:000b:00b |
| RLL (2, 7) MODULATION | 000100b:000100b:RMNDR |
| RMNDR ATTACHED TO SECOND INPUT | 00 00000000b |
| DIVIDED IN A UNIT OF MODULATION | 000b:000b:000b:0b |
| RLL (2, 7) MODULATION | 000100b:000100b:000100b:RMNDR |

(Herein, ":" represents a separation boundary of bits; "RMNDR" represents non-modulated remainder bit.)

The following describes a way of solving the above problem of generating such remainder data with reference to Tables 1 and 2.

The first parallel binary 8-bit data, for example, 00000000b is divided into two parts 000 and 000 by MSB and the divided two parts 000 and 000 are modulated into 000100 and 000100. However, remainder two bits 00 in the LSB does not correspond to any of the RLL (2, 7) coded data in Table 1. In other words, the remainder two bits can not be modulated alone without being attached to the head of further input parallel data of 1 bit or 2 bits, so that the resultant non-modulated bits are generated as the remainder data.

According to the present invention, in order to solve this problem, the non-modulated remainder bits are attached to the head of the next input parallel binary data so that the next input parallel data with the remainder bit or bits attached thereto are subjected to modulation. By this way, the remainder bits of the first input parallel data can be modulated together with the next input parallel data.

FIG. 1 shows a basic structure of a digital modulator circuit for explaining the principle of the present invention. Input pre-modulation data a of a fixed-length code is input to a logic circuit 1 composed of e.g. a ROM as represented by data a' via a flip-flop circuit 2 provided in the modulator circuit. In regard of output data of the logic circuit 1, the logic circuit 1 forms an output consisting of post-modulation data c, modulated bit number output d, digital parallel remainder bit output e, and remainder bit number output f. The digital parallel remainder bit output data e (referred to as the "remainder bit output" hereinafter) of a fixed-length code represents a non-modulated remainder of the fixed-length code digital parallel data and the output data f (referred to as the "remainder bit number output" hereinafter) represents the number of remainder bits included in the remainder bit output e. The remainder bit output e and the remainder bit number output f are generated from the logic circuit 1 because the whole bits of one time input parallel data a can not be generally allotted in modulation units without remainder when modulating a fixed-length code into a variable-length code in response to the previous input pulse b.

The remainder bit output e and the remainder bit number output f are fed back to the logic circuit 1 via the flip-flop 2 respectively as remainder bit input data g of fixed-length code digital parallel data and remainder bit number input h representing the number of remainder bit or bits included in the remainder bit input g, where the flip-flop 2 is operated in response to the input clock pulse signal b.

In other words, the data to be modulated in response to the present input pulse includes the pre-modulation data a fed from an external device, the remainder bit input g corresponding to the remainder bit output e and the remainder bit number input h corresponding to the remainder bit number output f where the output e and f are generated in response to the previous input pulse b previously input to the flip-flop 2.

To the logic circuit 1 connected is a buffer circuit 3 which receives an input of the post-modulation data c and the modulation bit number output d as well as the input pulse b thereby to output of parallel data i of a variable-length code, where the bits of the parallel data i have been all modulated.

Figure 3:
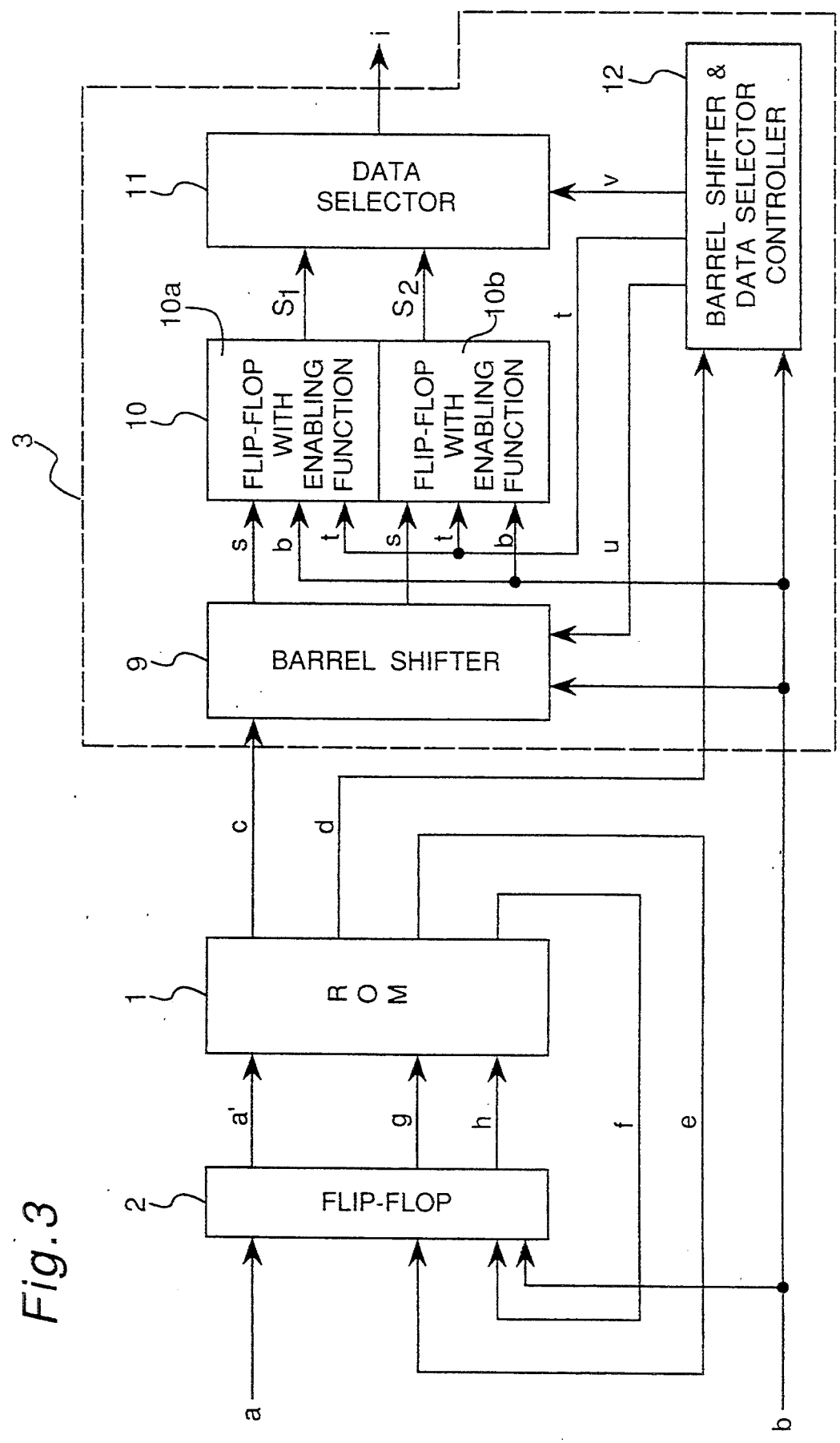
FIG. 3 is a block diagram of a digital modulator circuit in accordance with an embodiment of the present invention.

In more detail, FIG. 3 shows a preferred embodiment of a digital modulator circuit in accordance with the present invention of FIG. 1, where similar parts are designated by the same reference numerals.

Referring to FIG. 3, the input pre-modulation data a is modulated into a parallel variable-length code data c by means of a ROM 1 serving as a logic circuit. In this modulation process for modulating from the fixed-length code into the variable-length code, the whole bits of one time input parallel pre-modulation data a can not be generally allotted in modulation units without remainder. Therefore, the modulation of the input parallel pre-modulation data a can not be completed in a unit of modulation bits amount, and a part of bits of the pre-modulation data a remains as non-modulated data to result in producing remainder data e. The remainder e is output from the ROM 1 to be fed back to the ROM 1 as the remainder bit input g via the flip-flop 2. The flip-flop 2 is operated in response to an input pulse b. Then the remainder bit input g is modulated together with the next parallel pre-modulation data a input at the time of the next input pulse. Since the bit number of the remainder data included in the remainder data output e is not constant, the remainder bit number output f is simultaneously fed back to the ROM 1 as the remainder bit number input h via the flip-flop 2.

Since the number of the bits of the modulated data included in the post-modulation data c is not constant, the modulated bit number output d is simultaneously output from the ROM 1.

In regard of the post-modulation data c output from the ROM 1, the post-modulation data c has a data amount two times greater than the data amount of the input pre-modulation data a together with the remainder data included in the remainder bit data e. Then the post-modulation data c is input to a barrel shifter 9 where the input data c is shifted according to a data shift amount u which is calculated by a barrel shifter & data selector controller (referred to as "BSDS controller" hereinafter) 12 in such a manner that the input data c is arranged continuously with the modulated bit of the post-modulation data which has been modulated in response to the previous input pulse.

Output data s of the barrel shifter 9 to be input to a latch 10 has a data amount four times greater than that of the pre-modulation data a. The latch 10 is composed of two latch flip-flops 10a and 10b each having an enabling function for each bit. The BSDS controller 12 also generates an enabling signal t corresponding to the modulated bits of the post-modulation data c output from the ROM 1 and the enabling signal t is simultaneously input to each of the latch flip-flops 10a and 10b having an enabling function for each bit so that only the modulated bits of the post-modulation data c can be latched.

Output data of the latch 10 having an enabling function for each bit is distributed into two parts of data S1 and S2 each having a data amount two times greater than that of the pre-modulation data a. Each part of the distributed data S1 and S2 is input to a data selector 11. The data selector 11 is switched when the output data s of the barrel shifter 9 is latched by the latch 10 lying over the boundary or in coincide with the boundary of the input parallel data entered to the two latch flip-flops 10a and 10b each having an enabling function for each bit. The switching operation of the data selector 11 is effected by receiving a data selecting signal v which is transmitted from the BSDS controller 12 for selecting the data to be output from the data selector 11.

The shift amount u for shifting the input data c input to the barrel shifter 9 and data switching signal v for switching the data selector 11 are calculated by means of the BSDS controller 12 according to the modulation bit number d output from the ROM 1.

Figure 4:
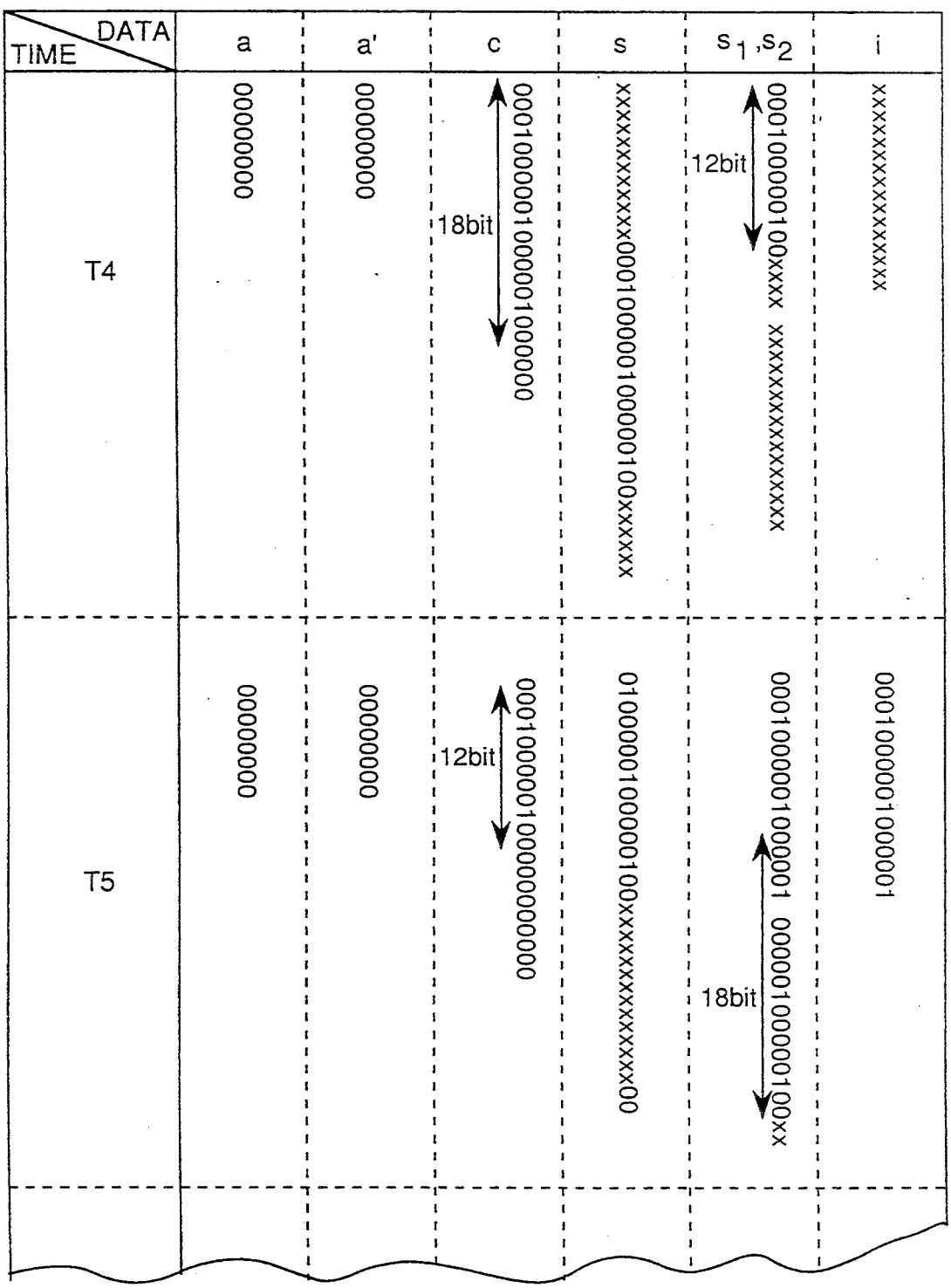
FIG. 4 is a schematic diagram showing a data flow of a digital modulation circuit according to the present invention.

The following describes the operation of the buffer circuit 3 consisting of the blocks 9 through 12 with reference to FIG. 4.

FIG. 4 shows an example of data flow when binary coded parallel data 00000000b is input to the modulator circuit according to the present embodiment. In FIG. 4, the vertical direction represents time points T1 through T7 which are separated by horizontal dotted lines with the input clock pulses b, while the horizontal direction of FIG. 4 represents the data of the blocks 1, 2, 9, 10 and 11, where the data is separated by vertical dotted lines. The data of each block at a specific time T is specified by separating a square area with the vertical and horizontal dotted lines.

The binary input parallel data 00000000 of the flip-flop 2 input at time T1 is latched in the flip-flop 2 at time T2 and the output data 00000000 thereof is input to the ROM 1 to be modulated into RLL (2, 7) coded data serving as the output of the ROM 1 at time T2, where the range of the bits amount indicated by an arrow line represents the modulated data (which is represented by 12 bits in this case). The number of the bits of the modulated data is variable in a range from 10 bits to 22 bits according to the boundary of data modulation. The rest except the modulated 12 bits are all 0 irrespective of modulation boundary.

Then, at time T3, the data c input to the barrel shifter 9 is so shifted as to align in time series according to the shift amount signal u transmitted from the BSDS controller 12 and the shifted data s is output from the barrel shifter 9. At time T3, since the first data is shifted in the barrel shifter 9, the output data of the barrel shifter 9 is aligned from the edge of the parallel data.

While at time T4, the input parallel data in the barrel shifter 9 is so shifted as to align to continuously succeed to the data shifted at time T3 according to the shift amount signal u transmitted from the BSDS controller 12 so that the shifted data is output from the barrel shifter 9. Also at time T4, among the modulated data output from the barrel shifter 9, the data in a range designated by an arrow line is latched in the latch 10 composed of two flip-flops 10a and 10b having an enabling function for each bit. The BSDS controller 12 calculates which range of the bits is to be latched and the calculated result is transmitted to the latch flip-flops 10a and 10b as an enabling signal t. At time T4, although the modulated data of 12 bits is output from the latch 10, the output data does not lie across or coincide with the boundary of the data latched in the two latch flip-flops 10a and 10b. Therefore, there appears no modulated output data from the data selector 11.

At time T5, the modulated data of 18 bits is output from the latch 10 while the output data lies across the boundary between the data of the latch flip-flops 10a and 10b, and therefore modulated data is output from the data selector 11.

Then, at time T6, since further modulated data is output from the latch 10 while lying across the boundary between the data of the two latch flip-flops 10a and 10b, therefore the output of the data selector 11 is switched by a data switching signal v transmitted from the BSDS controller 12 so that the modulated data i is output from the data selector 11. At time T6, since the modulated data corresponding to two words is secured, the output of the data selector 11 is once more switched by transmitting a data switching signal v from the BSDS controller 12 at time T7 so that modulated data i is output from the data selector 11. It is noted here that, when the data switching signal v is varied, the modulated data of the output i is secured.

Figure 2:
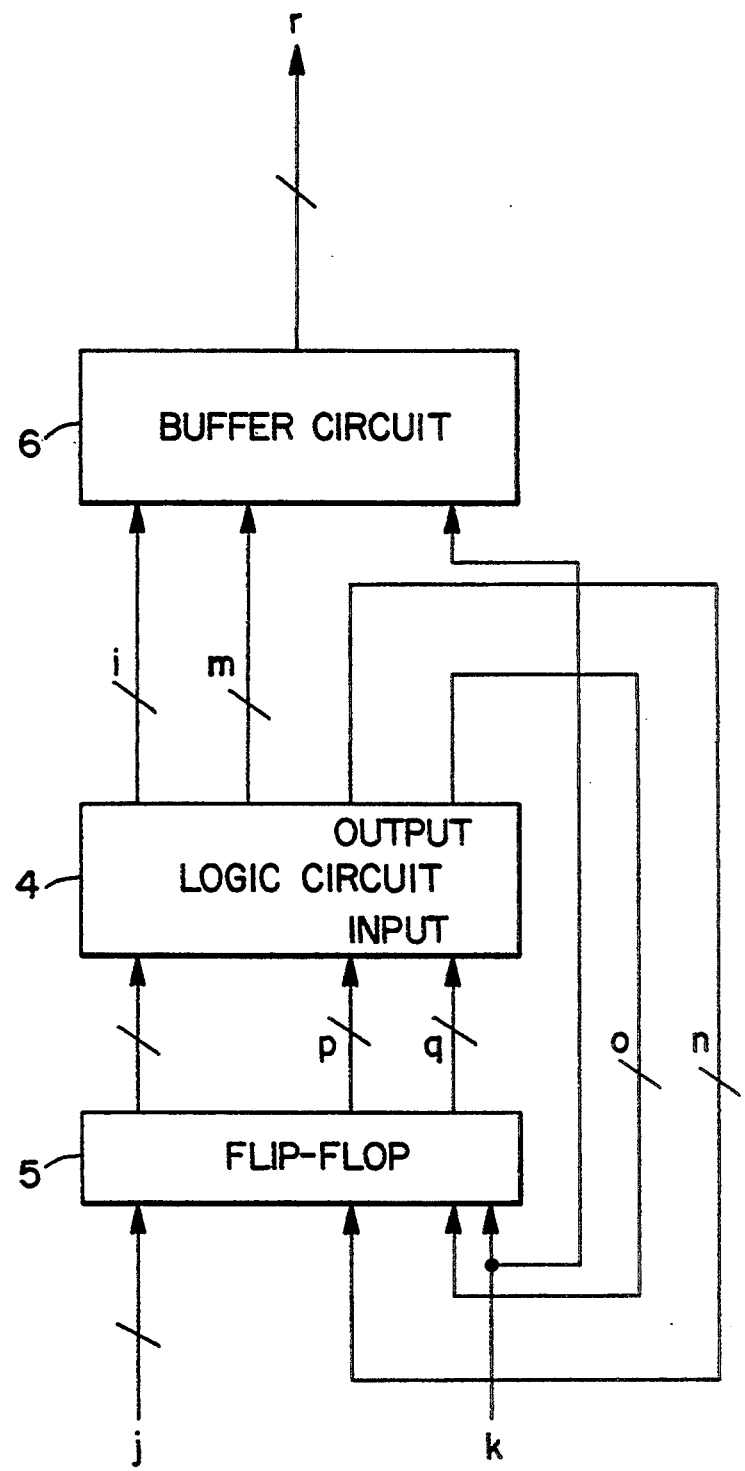
FIG. 2 is a block diagram for explaining a basic construction of a digital demodulator circuit in accordance with the present invention.
Figure 5:
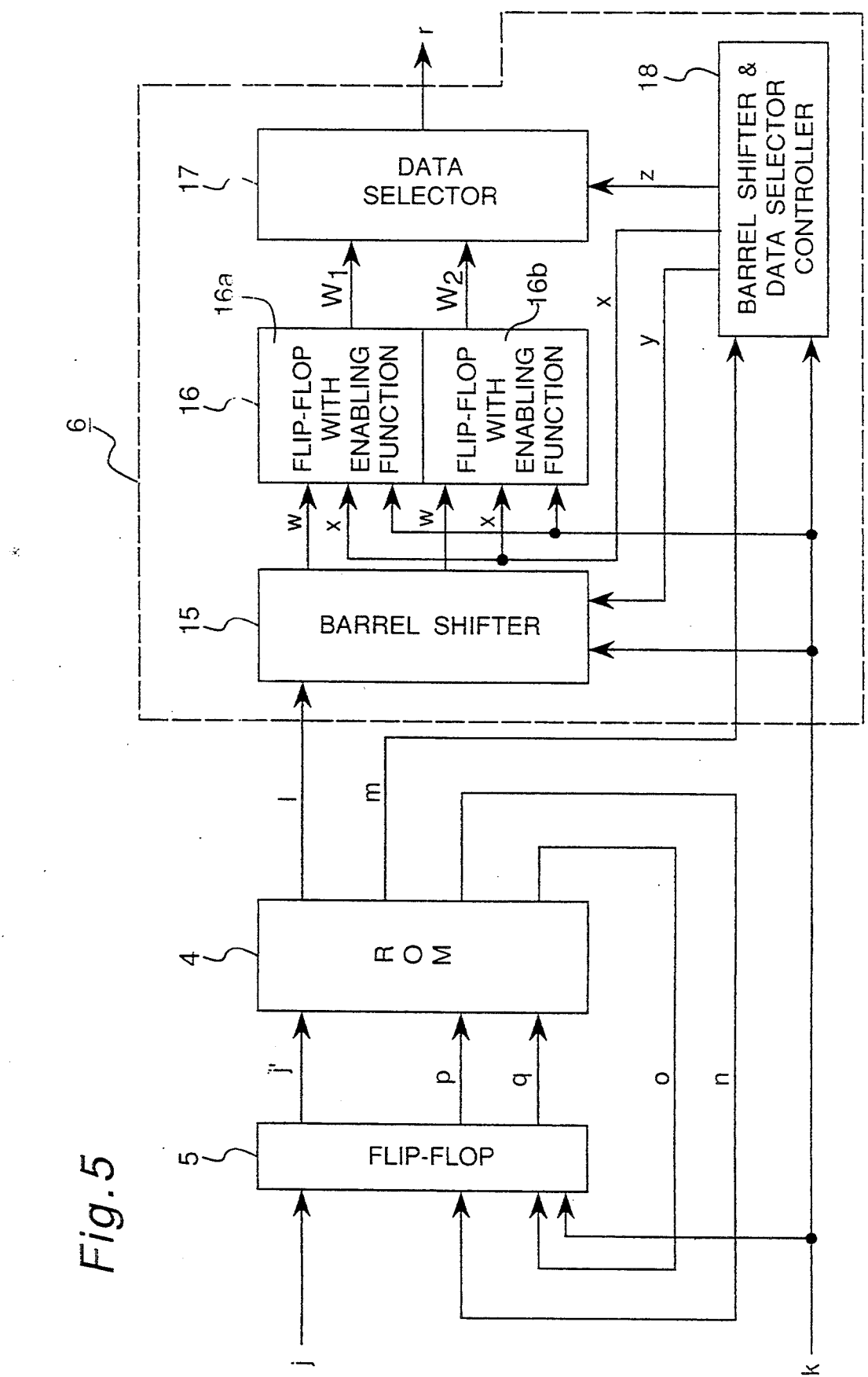
FIG. 5 is a block diagram of a digital demodulator circuit in accordance with an embodiment of the present invention.
Figure 6:
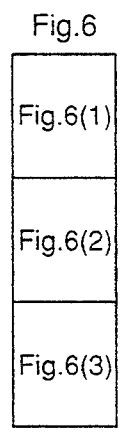
FIG. 6 is a schematic diagram showing a data flow of a digital demodulation circuit according to the present invention.
Figure 6:
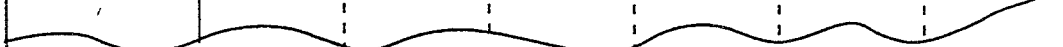
Figure 7:
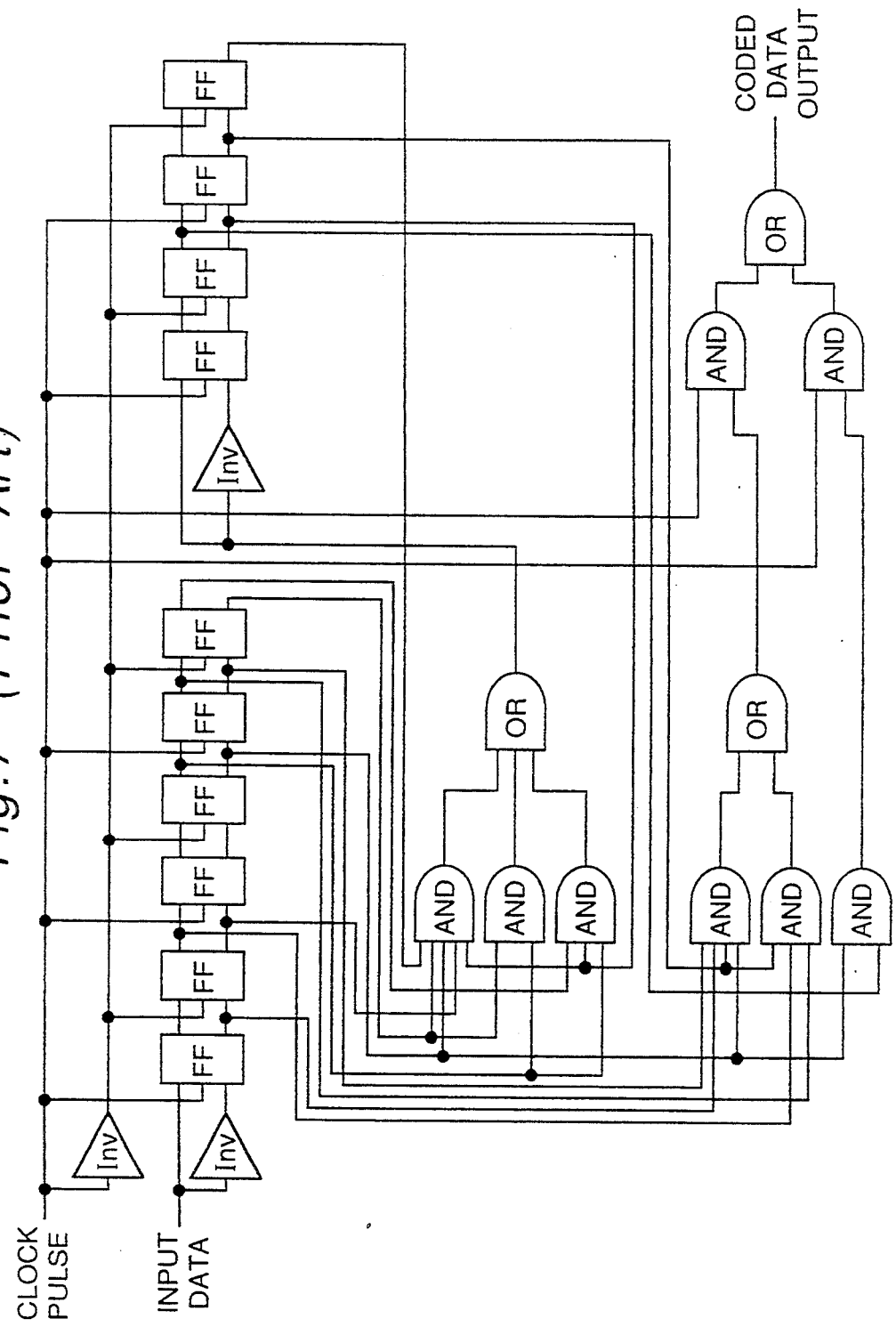
FIG. 7 is a block diagram showing a conventional digital modulator circuit.
Figure 8:
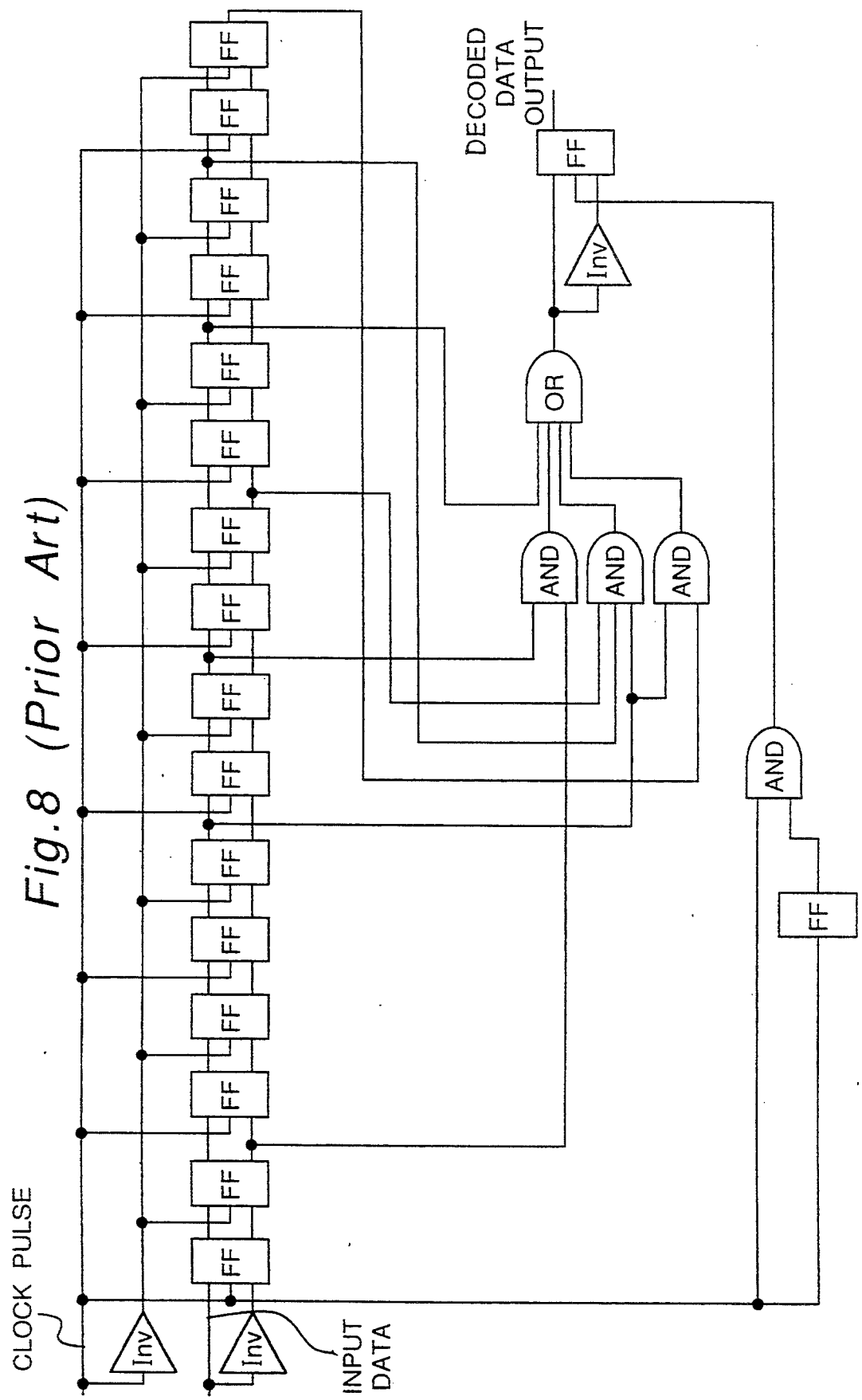
FIG. 8 is a block diagram showing a conventional digital demodulator circuit.

The following describes a demodulator circuit in accordance with an embodiment of the present invention with reference to FIGS. 2, 5, and 6.

FIG. 2 shows a basic structure of a digital demodulator circuit for explaining the principle of the present invention. Input pre-demodulation data j of a variable-length code is input to a logic circuit 4 composed of a ROM or the like as indicated by data j' via a flip-flop circuit 5 provided in the demodulator circuit. The digital demodulator further includes a buffer circuit 6 receiving the output from the logic circuit 4.

Meanwhile the logic circuit 4 generates an output consisting of a post-demodulation data i, a demodulation bit number m, a remainder bit output n, and a remainder bit number output o.

The variable-length code digital parallel remainder bit output n represents a remainder of the variable-length code digital parallel data (referred to as the "remainder bit output" hereinafter). The remainder bit number output o represents the number of remainder bits included in the remainder bit output n which is generated because the whole bits of one time input parallel data j of a variable-length code can not be generally allotted in demodulation units without remainder where the input parallel data j is input to the flip flop 5 operating in response to an input pulse k. By way of the flip flop 5, the remainder bit output n and the remainder bit number output o are fed back to the logic circuit 4 as a variable-length code digital parallel remainder bit input p (referred to as the "remainder bit input" hereinafter) and a remainder bit number input q included in the remainder bit input. In other words, data demodulated at one pulse includes the pre-demodulation data j input from an external device outside the demodulator circuit, the remainder bit input p at the previous input pulse k, and the remainder bit number input q.

The buffer circuit 6 receives an input of the post-demodulation data i, the demodulation bit number output m and input pulse k thereby to output a parallel digital data r of a fixed-length code where bits of the output data r are all demodulated.

In more detail, FIG. 5 shows the construction of a digital demodulator circuit of FIG. 2 in accordance with an embodiment of the present invention. It is noted here that the digital demodulator circuit of the present embodiment demodulates a parallel variable-length code into a parallel fixed-length code. It is also assumed that the pre-demodulation data amount is reduced by half after demodulation in the digital demodulator circuit and the other conditions are similar to those of the modulator circuit shown in FIG. 3.

As shown in FIG. 5, in the digital demodulator circuit of the present invention, the logic circuit 4 is composed of a ROM or the like. The buffer circuit 6 comprises a barrel shifter 15, a latch 16 composed of two flip-flops 16a and 16b each having an enabling function for each bit, a data selector 17, and a barrel shifter & data selector (BSDS) controller 18.

In regard of input parallel data of the ROM 4 serving as a logic circuit, to the ROM 4 applied are the digital parallel data j of a variable-length code (referred to as the "pre-demodulation data" hereinafter), a variable-length code digital parallel remainder bit input p and a remainder bit number input q representing the number of the remainder bits included in the variable-length code digital parallel remainder bit input.

While in regard of output data of the ROM 4, the ROM 4 outputs digital parallel data 1 of a fixed-length code (referred to as the "post-demodulation data" hereinafter), a fixed-length code bit number m representing the number of post-demodulation bits included in the post-demodulation data 1, digital parallel remainder bit output n of a variable-length code representing the remainder of the pre-modulation data j, and a remainder bit number output o representing the number of remainder bits included in the digital parallel remainder bit output n.

The digital parallel remainder bit output n is took place because the whole bits of one time input parallel pre-modulation data j can not be generally allotted in demodulation units without remainder when demodulating a variable-length code into a fixed-length code.

The flip-flop 5 is operated in response to an input pulse k so that the digital parallel remainder bit output n and the remainder bit number output o output from the logic circuit 4 are fed back to the ROM 4 as the digital parallel remainder bit input p as well as the remainder bit number input q via the flip-flop 5.

The buffer circuit 6 comprises the barrel shifter 15, latch 16 consisting of two latch flip-flops 16a and 16b having an enabling function for each bit, data selector 17, and BSDS controller 18. The buffer circuit 6 receives the post-demodulation data 1, fixed-length code bit number m representing the post-demodulation number of bits included in the post-demodulation data 1 and input pulse k thereby to form an output of a fixed-length code digital parallel data r of which bits have been all demodulated.

The following describes the operation of the demodulator circuit of FIG. 5.

The input pre-demodulation data j is demodulated into the parallel fixed-length code data 1 by means of the ROM 4. In the above case, the whole bits of one time input parallel data j can not be generally allotted in demodulation units without remainder. Therefore, a part of the bits of the parallel variable-length code data j cannot be demodulated to produce a resultant remainder n as non-demodulated data. The remainder n is fed back to the ROM 4 as the remainder bit input p via the flip-flop 5 in response to the next input pulse k and then demodulated together with parallel variable-length code data j input at the next input pulse k. Since the number of bits of the digital parallel remainder bit output n is not constant, the remainder bit number o is simultaneously fed back to the ROM 4 as the remainder bit number input q via the flip-flop 5.

In regard of the post-demodulation data 1, since the number of post-demodulated bits included therein is not constant, the bit number m of the post-demodulated fixed-length code is simultaneously output from the ROM 4.

The post-demodulation data 1 output from the ROM 4 has a data amount which is a half of that of the input pre-demodulation data j together with the remainder bit output n. The post-demodulation data 1 is input to the barrel shifter 15 where the input parallel data is shifted according to a shifting amount y in such a manner that the shifted data is arranged continuously with the demodulated bit of the post-demodulation data 1 demodulated in response to the previous input clock pulse. The shifting amount y is calculated by means of the BSDS controller 18.

Output data w of the barrel shifter 15 having a data amount identical to that of the pre-demodulation data j is input to the flip-flops 16a and 16b of the latch 16 having an enabling function for each bit. Meanwhile, the BSDS controller 18 outputs an enabling input signal x attached to each of the bits of the demodulated data output from the ROM 4. The enabling input data x is input to the latch 16 composed of the two flip-flops 16a and 16b each having an enabling function for each bit in simultaneous with the input of the data w so that only the demodulated part of the post-demodulation data 1 output from the ROM 4 can be latched in the latch 16.

To the two flip-flops 16a and 16b of the latch 16 having an enabling function for each bit, the input data w is distributed into two groups of data w each having a data amount smaller a half of that of the pre-demodulation data j. Each group of distributed data W1 and W2 output from the flip-flops 16a and 16b are input to the data selector 17. The data selector 17 is switched when the output data of the barrel shifter 15 is latched in the latch 16 while the latched data lies across the boundary or in coincident with the boundary between the two groups of data in the two flip-flops 16a and 16b. The switching operation of the data selector 17 is effected by a data switching signal z. The value of the shifting amount y of the barrel shifter 15 and data switching timing z of the data selector 17 are calculated according to the modulation bit number m transmitted from the ROM 4 to the BSDS controller 18. The barrel shifter 9 and the data selector 17 are respectively controlled according to the data shift amount y and the data switching signal z.

With the above-mentioned arrangement, when variable-length code data is demodulated into fixed-length code data, the remainder bit output n can be demodulated together with the variable-length code data input j in response to the next input pulse k to allow demodulation in parallel data form.

The following describes the operation of the buffer circuit 6 consisting of the blocks 15 through 18 with reference to FIG. 6.

FIG. 6 shows an example of data flow when binary coded parallel RLL (2, 7) coded data of continuous 000100b patterns is input to the demodulator circuit according to the present embodiment. In FIG. 6, the vertical direction represents time points T1 through T7 which are separated by horizontal dotted lines with the input clock pulses k, while the horizontal direction of FIG. 6 represents the data of the blocks 4, 5 and 15 through 17, where the data is separated by vertical dotted lines. The data of each block at a specific time T is specified by separating a square area with the vertical and horizontal dotted lines.

The RLL (2, 7) coded input parallel data of 000100 patterns of the flip-flop 5 input at time T1 is latched in the flip-flop 5 at time T2 and the output data 000100 pattern thereof is input to the ROM 4 to be demodulated from RLL (2, 7) coded data into binary data serving as the output of the ROM 4 at time T2, where the range of the bits amount indicated by an arrow line represents the demodulated data (of 6 bits in this case). The number of the bits of the demodulated data is variable in a range from 5 bits to 11 bits according to the boundary of data demodulation. The rest except the demodulated 6 bits are all 0 irrespective of demodulation boundary.

Then, at time T3, the data 1 input to the barrel shifter 15 is so shifted as to align in time series according to the shift amount signal y transmitted from the BSDS controller 18 and the shifted data w is output from the barrel shifter 15. At time T3, since the first input parallel data is shifted in the barrel shifter 15, the output data of the barrel shifter 15 is aligned from the edge of the parallel data.

While at time T4, the input parallel data in the barrel shifter 15 is so shifted as to align to continuously succeed to the data shifted at time T3 according to the shift amount signal y transmitted from the BSDS controller 18 so that the shifted data w is output from the barrel shifter 15. Also at time T4, among the demodulated data output from the barrel shifter 15, the data in a range designated by an arrow line is latched in the latch 16 composed of two flip-flops 16a and 16b having an enabling function for each bit. The BSDS controller 18 calculates which range of the bits is to be latched and the calculated result is transmitted to the latch flip-flops 16a and 16b as an enabling signal x. At time T4, although the demodulated data of 6 bits is output from the latch 16, the output data does not lie across or coincide with the boundary of the data latched in the two latch flip-flops 16a and 16b. Therefore, there appears no demodulated output data from the data selector 17.

At time T5, the demodulated data of 9 bits is output from the latch 16 while the output data lies across the boundary between the data of the latch flip-flops 16a and 16b, and therefore demodulated data is output from the data selector 17.

Then, at time T6, since further demodulated data is output from the latch 16 while lying across the boundary between the data of the two latch flip-flops 16a and 16b, therefore the output of the data selector 17 is switched by a data switching signal z transmitted from the BSDS controller 18 so that the demodulated data i is output from the data selector 11. At time T6, since the demodulated data corresponding to two words is secured, the output of the data selector 17 is once more switched by receiving a data switching signal z transmitted from the BSDS controller 18 at time T7 so that demodulated data r is output from the data selector 17. It is noted here that, when the data switching signal z is varied, the demodulated data of the output r is secured.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. A digital modulator circuit in which input digital parallel data of a fixed-length code fed from an external device is modulated in a form of a parallel data arrangement in synchronization with an input setting clock pulse signal for setting the input parallel data, thereby to generate digital parallel data of a variable-length code simultaneously with modulation bit number output representing the number of the bits of the modulated data included in the digital parallel post-modulation data, said digital modulator circuit comprising:

flip-flop means for latching the input parallel data which is operable in synchronization with the input clock pulse;

logic circuit means receiving the input parallel data of a fixed-length code via said flip-flop means thereby to generate an output consisting of the post-modulation data, modulated bit number output, digital parallel remainder bit output of a fixed-length code, and remainder bit number output, wherein the digital parallel remainder bit output represents a remainder of the non-modulated fixed-length code digital parallel data and the remainder bit number output represents the number of remainder bits included in the remainder bit output, where the remainder bit output and the remainder bit number output are both generated from said logic circuit means because the whole bits of one time input parallel pre-modulation data can not be generally allotted in modulation units without remainder when modulating a fixed-length code into a variable-length code in response to the previous input pulse, wherein the remainder bit output and the remainder bit number output are fed back to said logic circuit means via said flip-flop means responsive to the previous input pulse previously input to said flip-flop means respectively as remainder bit input data of fixed-length code digital parallel data and remainder bit number input representing the number of remainder bit or bits included in the remainder bit input, whereby the remainder bit output data can be attached to the head of the fixed-length code input parallel data in synchronization with the next input pulse so that the remainder bit output data can be modulated together with the next input fixed-length code data.

2. The digital modulator circuit as claimed in claim 1 further comprising buffer circuit means which is connected to said logic circuit means for receiving inputs of the post-modulation data and the modulation bit number output thereby to output parallel data of a variable-length code, where the bits of the parallel data have been all modulated.

3. The digital modulator circuit as claimed in claim 2, wherein said buffer circuit means comprises:

a barrel shifter, latch circuit means connected to said barrel shifter and composed of two flip-flop circuits each having an enabling function for each bit, a data selector connected to said latch circuit means, and a controller for controlling said barrel shifter and said data selector.

4. A digital demodulator circuit in which input digital parallel data of a variable-length code fed from an external device is demodulated in a form of a parallel data arrangement in synchronization with an input setting clock pulse signal for setting the input parallel data, thereby to generate digital parallel data of a fixed-length code simultaneously with demodulation bit number output representing the number of the bits of the demodulated data included in the digital parallel post-demodulation data, said digital demodulator circuit comprising:

flip-flop means for latching the input parallel data which is operable in synchronization with the input clock pulse;

logic circuit means receiving the input parallel data of a variable-length code via said flip-flop means thereby to generate an output consisting of the post-demodulation data, demodulated bit number output, digital parallel remainder bit output of a variable-length code, and remainder bit number output, wherein the digital parallel remainder bit output represents a remainder of the non-demodulated variable-length code digital parallel data and the remainder bit number output represents the number of remainder bits included in the remainder bit output, where the remainder bit output and the remainder bit number output are both generated from said logic circuit means because the whole bits of one time input parallel pre-demodulation data can not be generally allotted in demodulation units without remainder when demodulating a variable-length code into a fixed-length code in response to the previous input pulse, wherein the remainder bit output and the remainder bit number output are fed back to said logic circuit means via said flip-flop means responsive to the previous input pulse previously input to said flip-flop means respectively as remainder bit input data of fixed-length code digital parallel data and remainder bit number input representing the number of remainder bit or bits included in the remainder bit input, whereby the remainder bit output data can be attached to the head of the fixed-length code input parallel data in synchronization with the next input pulse so that the remainder bit output data can be demodulated together with the next input fixed-length code data.

5. The digital demodulator circuit as claimed in claim 4 further comprising buffer circuit means which is connected to said logic circuit means for receiving inputs of the post-modulation data and the demodulation bit number output thereby to output parallel data of a fixed-length code, where the bits of the parallel data have been all demodulated.

6. The digital demodulator circuit as claimed in claim 5, wherein said buffer circuit means comprises:
   a barrel shifter,
   latch circuit means connected to said barrel shifter and composed of two flip-flop circuits each having an enabling function for each bit,
   a data selector connected to said latch circuit means, and
   a controller for controlling said barrel shifter and said data selector.

* * * * *